United States Patent [19]

van Doan et al.

[11] Patent Number: 5,063,472
[45] Date of Patent: Nov. 5, 1991

[54] DEVICE FOR DETECTING SUPERCONDUCTOR QUENCHING AND APPLICATION TO A SUPERCONDUCTING CURRENT LIMITER

[75] Inventors: Pham van Doan, Meyzieu; Jean-Pierre Dupraz, Lyons; Alain Février, Maurepas, all of France

[73] Assignee: GEC Alsthom SA, Paris, France

[21] Appl. No.: 502,730

[22] Filed: Apr. 2, 1990

[30] Foreign Application Priority Data

Apr. 4, 1989 [FR] France .................. 89 04410

[51] Int. Cl.[5] ........................... H02H 9/02
[52] U.S. Cl. ...................... 361/19; 361/45; 361/87; 361/58; 505/850; 505/843; 324/248
[58] Field of Search ............ 361/19, 45, 46, 58, 361/93, 86, 87; 505/843, 845, 846, 850; 324/547, 529, 248, 546

[56] References Cited

U.S. PATENT DOCUMENTS

| | | | |
|---|---|---|---|
| 3,579,035 | 5/1971 | Burnier et al. | 361/19 |
| 4,371,943 | 2/1983 | Woods et al. | 324/71.6 |
| 4,644,273 | 2/1987 | Bobb | 505/845 |
| 4,688,134 | 8/1987 | Freeman et al. | 361/45 |
| 4,910,626 | 3/1990 | Collet et al. | 361/19 |

FOREIGN PATENT DOCUMENTS 1932379  1/1971  Fed. Rep. of Germany .

OTHER PUBLICATIONS

Cryogenics, vol. 19, No. 2, Feb. 1979, pp. 114–115, IPC Business Press; B. G. Dubasov et al.: "Measurement of the energy loss in superconducting magnets".

Proceedings of the International Cryogenic Engineering, Kyoto, 1974, pp. 174–176, IPC Press, London, GB; R. J. Barlett et al.: "G1 conductor tests for d.c. superconducting power transmission".

Primary Examiner—Todd E. DeBoer
Attorney, Agent, or Firm—Sughrue, Mion, Zinn Macpeak & Seas

[57] ABSTRACT

Device for detecting the quenching of part a superconducting element comprising two identical superconducting conductors electrically connected in parallel is provided with means (104, 105, 109, 110) of detecting a difference in intensity or phase between the currents flowing in the conductors. An application to a superconducting current limiter is described.

18 Claims, 5 Drawing Sheets

DEVICE FOR DETECTING SUPERCONDUCTOR QUENCHING AND APPLICATION TO A SUPERCONDUCTING CURRENT LIMITER

This invention relates to a device for detecting, in a superconductor element operating in a superconducting state, the occurrence of a transition to the nonsuperconducting or quenched state.

A local transition in a superconducting wire from the superconducting state to the normal resistive state (simply termed "quenching" hereinafter), brought about either by a local cooling failure or by magnetic or mechanical disturbances, if it persists for some time, can damage the wire.

It is therefore important to be able to detect such transitions as soon as they occur in order to be able to take suitable protective steps.

It has been proposed to detect quenching in superconducting conductors consisting of several strands around a core conductor, by measuring the voltage between the core conductor and the outer strands, a voltage increase indicating the occurrence of a local transition. Reference is made regarding this subject to the article published in IEEE Transactions on Magnetics, Vol. MAG 17, No. 5, September 1981, entitled "High Sensitive Quench Detection Method Using an Integrated Test Wire".

Such a method, obviously, can only be used for devices in which the working voltages are small, for example less than or equal to a few hundred volts. This consideration excludes high-voltage applications such as those relating to current limiters for high-voltage networks.

Besides, the manufacture of the wire and the industrial production of a current limiter based on this method are more difficult.

One object of this invention is to provide a quench detection device with a sufficient sensitivity at all voltage ranges. Another object of this invention is to provide a detection device able to be used at high voltages, in other words, at voltages greater than tens of kilovolts.

In order to operate, the device according to the invention requires the superconductor element of which it is to detect the quenching to be made up of two identical superconducting conductors electrically connected in parallel. The element may be, for example, a coil comprising two coaxial, solenoid-shaped superconductor windings electrically connected in parallel and wound in opposite directions so as to limit the value of the coil's self-inductance. This is the example that will be used hereinafter to illustrate the invention.

The invention is based on the observation that has been made that when the superconductor element operates normally, the currents in each of the two conductors have the same intensity and are in phase. If quenching occurs in a small portion of one of the conductors, the current values in the two conductors become different and a phase difference appears between them.

The invention therefore provides a device for detecting a "going normal transition" in a superconductor, i.e. the quenching of a portion of a superconductor element comprising two identical superconductors electrically connected in parallel, wherein means are provided for detecting a difference of intensity or a phase-difference between the currents flowing in the two said conductors.

The invention will now be described in detail using an example in which the superconductor element is a superconducting coil being part of a current limiting device designed to protect a high voltage network. This example is illustrated by the appended drawings in which:

FIG. 1 diagrammatically represents a superconductor current limiter equipped with a quench detection device according to the invention;

Figure 1:
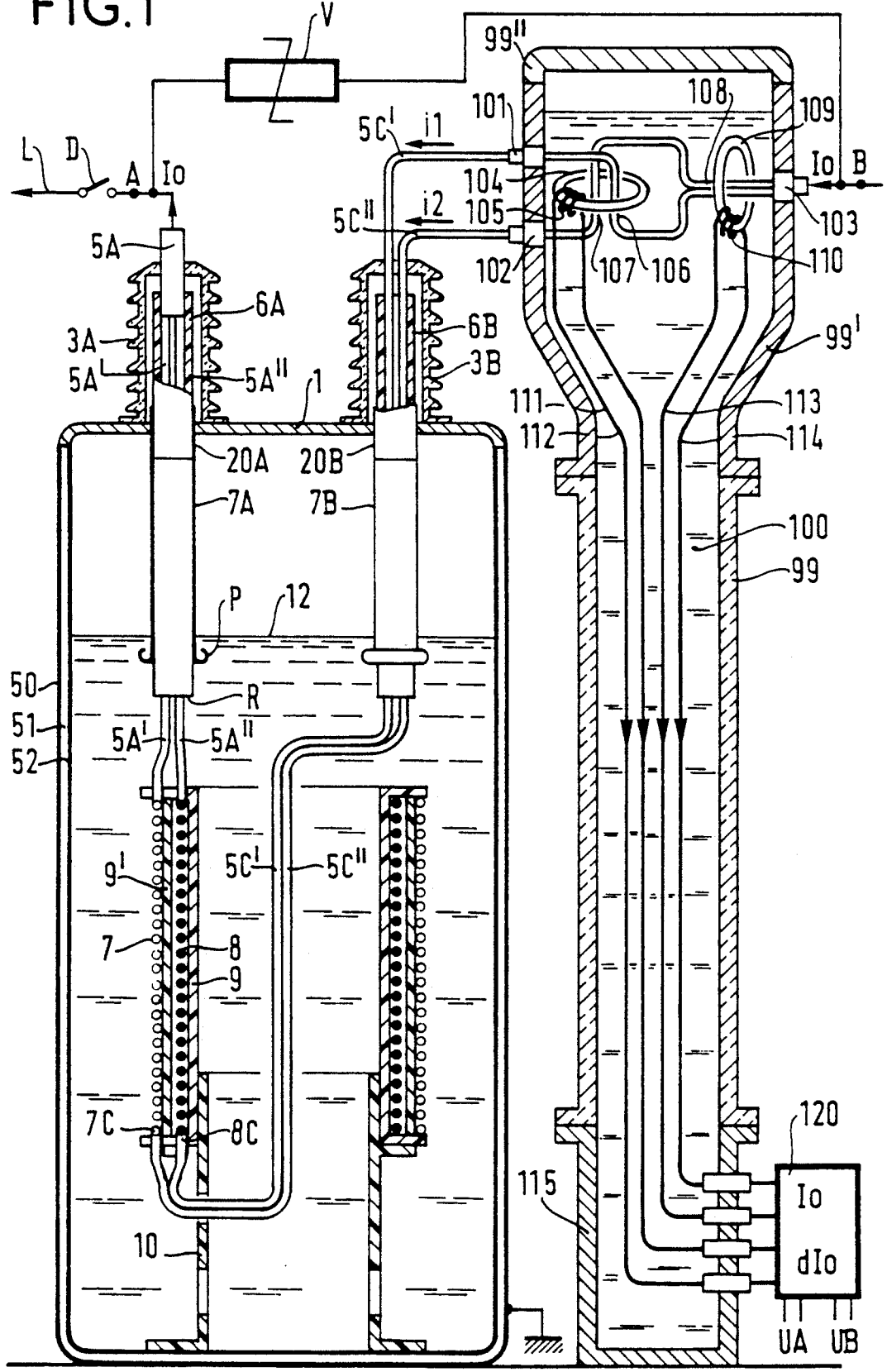

In FIG. 1, the reference numeral 1 designates a cryostat comprising a grounded metal tank consisting of two walls 50 and 52 separated by a space 51 kept at vacuum pressure. The cryostat is partly filled with a fluid 12 at a temperature enabling the coil used to assume the superconducting state. If the coil is made of niobium-titanium wire, the fluid used is liquid helium.

The tank is topped by two insulating bushings 3A and 3B made of a ceramic material, with sheds. A conductor 5A of solid copper is divided inside the bushing 3A into two unit conductors 5A' and 5A'', insulated by a same sheath 6A, which extends into the tank as far as a point R. The insulating sheath is itself surrounded by a conductive layer 7A terminating at a given level P in a corona shielding ring. Points P and R are located below the level 12 of the cryogenic liquid. The conductors 5A' and 5A'' are respectively connected to two superconducting conductors 7 an 8, wound respectively around two cylindrical and coaxial insulating sleeves 9 and 9', secured vertically in the tank by means of an insulating support 10 attached to the bottom of the tank. The two wires 7 and 8 are wound on their respective sleeves in opposite directions to cancel the self-inductance of the assembly as a whole. The ends 7C and 8C of the windings 7 and 8 are respectively coupled to two copper conductors 5C' and 5C'', electrically insulated from one another which, routed within the cryostat following the axis of the coils, pass into the bushing 3B. The bushing 3B features the same parts as bushing 3A. Like items in 3B are designated by the same numerals as in 3A, followed by the letter B. It should be noted however that the conductors 5C' and 5C'' remain insulated both inside and outside of bushing 3B.

The metal coatings 7A and 7B are insulated from the tank 1 by insulating portions 20A and 20B respectively.

In an alternative embodiment of the invention not shown in the figures, the conductors 5C' and 5C'' are made in the form of coaxial tubes, one of which is disposed inside the other.

Beside the cryostat 1 is arranged a detection assembly comprising an insulating case 99 laid on a metal tank 115 and filled with an insulating material 100, which may be liquid (oil), solid (epoxy resin) or gaseous (sulfur hexafluoride), depending upon the device's operating voltage. The insulating case 99 comprises a metal top 99' closed by a metal cap 99''. The case 99 comprises two inputs 101 and 102, to which the conductors 5C' and 5C'' are connected, and an output 103.

The first embodiment of the detection mode according to the invention now described is a detection by current transformers.

For this purpose, the inside of the tank is provided with a first magnetic toroidal core 104 on which is arranged a secondary winding 105. The primary winding consists of conductors 106 and 107 respectively connected to the inputs 101 and 102 and traversing the magnetic core 104. These conductors are arranged so that the currents will flow through them in opposite directions. The secondary winding 105 is connected, via conductors 111 and 112 passing through the insulating column 99, to an electronic measuring circuit schematically represented in the figure by the rectangle 120.

The conductors 106 and 107 are brought together on leaving the core 104 to form a single conductor 108 which passes through a second toroidal magnetic core 109; the conductor 108 thus constitutes the primary of a current transformer whose secondary consists of a winding 110 on the core 109 and whose outputs are connected, via conductors 113 and 114 running through insulating column 99, to the measuring circuit 120.

The assembly made up of the cryostat 1 and the just-mentioned transformer is inserted into an electrical line L to be protected, between a point A connected to the bushing 3A and a point B connected to the transformer output 103.

The line is equipped with a circuit breaker D with a low interrupting capacity, inserted in series in the line.

A varistor V is connected between the previously mentioned points A and B.

The operation of the current limiter is as follows:

in normal operation of the line, the circuit breaker D is closed and the line carries a nominal current Io.

in the event of a short circuit, the line current suddenly increases, which causes the superconductor windings 7 and 8 to go normal. Their resistance suddenly changes from zero to a large value. Introduction of this resistance in the line substantially reduces the value of the current, which decreases to a residual value easily interrupted by the circuit breaker D. The varistor V absorbs the electromagnetic energy in the event of overvoltages in the line.

There now follows a description of how the quenching in normal operation of a short length of one of the windings 7 or 8 can be detected.

In normal operation, the line current Io is evenly distributed between the conductors 7 and 8 of the superconducting coil. The toroidal core 104 measures a null current since its primary winding carries two oppositely flowing currents of same intensity.

When a small portion of either of the windings 7 and 8 goes normal, the currents in the two windings differ in intensity and phase. The intensity difference dIo is detected by the core 104 whose secondary winding 105 then becomes the site of a potential difference measured by the circuit 120. This same circuit can also detect a phase difference between the two currents, by combining in the classic fashion, the information supplied by the core 104 (vector difference between the currents) and that supplied by the core 109, corresponding to the sum of the two currents. The core 109 measures the continuous current Io as in any conventional current transformer. Attention is drawn to the fact that a plurality of toroidal cores like 109 can be provided within case 99 for counting, protection and like purposes.

When the current difference or the phase difference reaches a predetermined threshold value, indicating thereby that there is a risk of damage to the superconductor, a signal is generated to command immediate opening of circuit breaker D.

It is also possible to detect a quenching transition by observing the capacitive voltages between ground and each of the insulating bushings.

Figure 2:
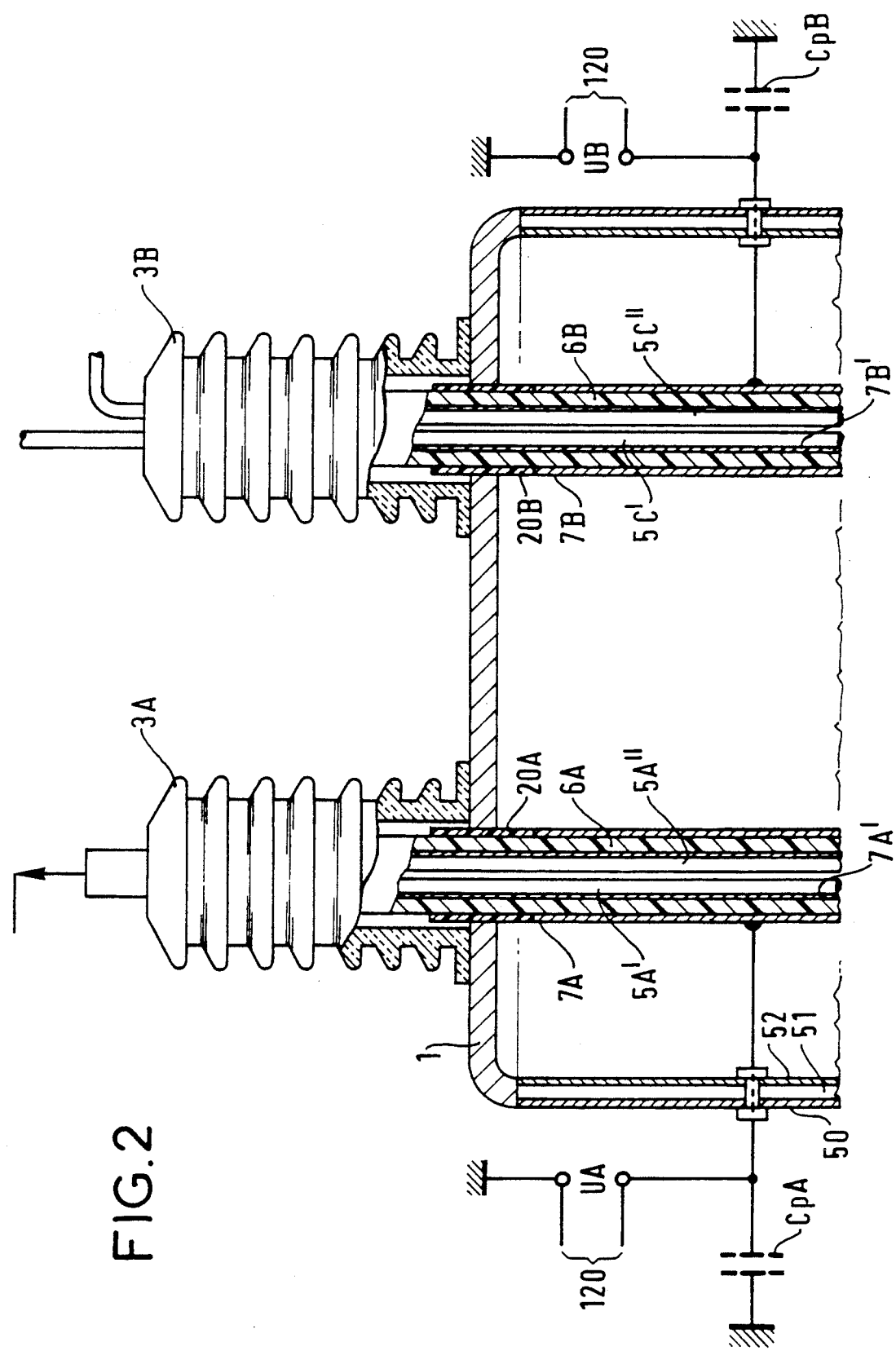
FIG. 2 is a diagram showing how a quench can be detected by measuring capacitive voltages.

Referring to FIG. 2, it can be seen that the insulating sheath 6A has an internal metal coating 7A' and that the insulating sheath 6B likewise has an internal metal coating 7B'. It can be seen that the capacitance CpA between the metal sheath 7A and ground generates a capacitive voltage UA and likewise the capacitance CpB between the metal sheath 7B and ground generates a capacitive voltage UB. The internal metallized surface 7A' forms, with sheath 7A, a high voltage capacitance CqA; likewise, the internal metallized surface 7B' forms, with sheath 7B, a high voltage capacitance CqB. Additional capacitances besides CpA and CpB can be provided to make UA and UB sufficiently small. When the device operates normally, the voltages UA and UB are equal; during a quench however, the difference $dU = UA - UB$ assumes a non-zero value. As of a certain threshold value of dU, a signal will trip open the circuit breaker D, as previously explained. This detection by the difference in capacitive voltages will be used in combination with a measurement of current or phase differences.

Measuring the capacitive voltage across the coil terminals is very useful in the very unlikely case of an identical local quenching occurring in both coils 7 and 8.

Detection of the intensity difference dIo and of the phase difference through the further measuring of the sum Io of the currents in the two conductors can be performed by other methods besides that described hereinbefore.

Figure 3:
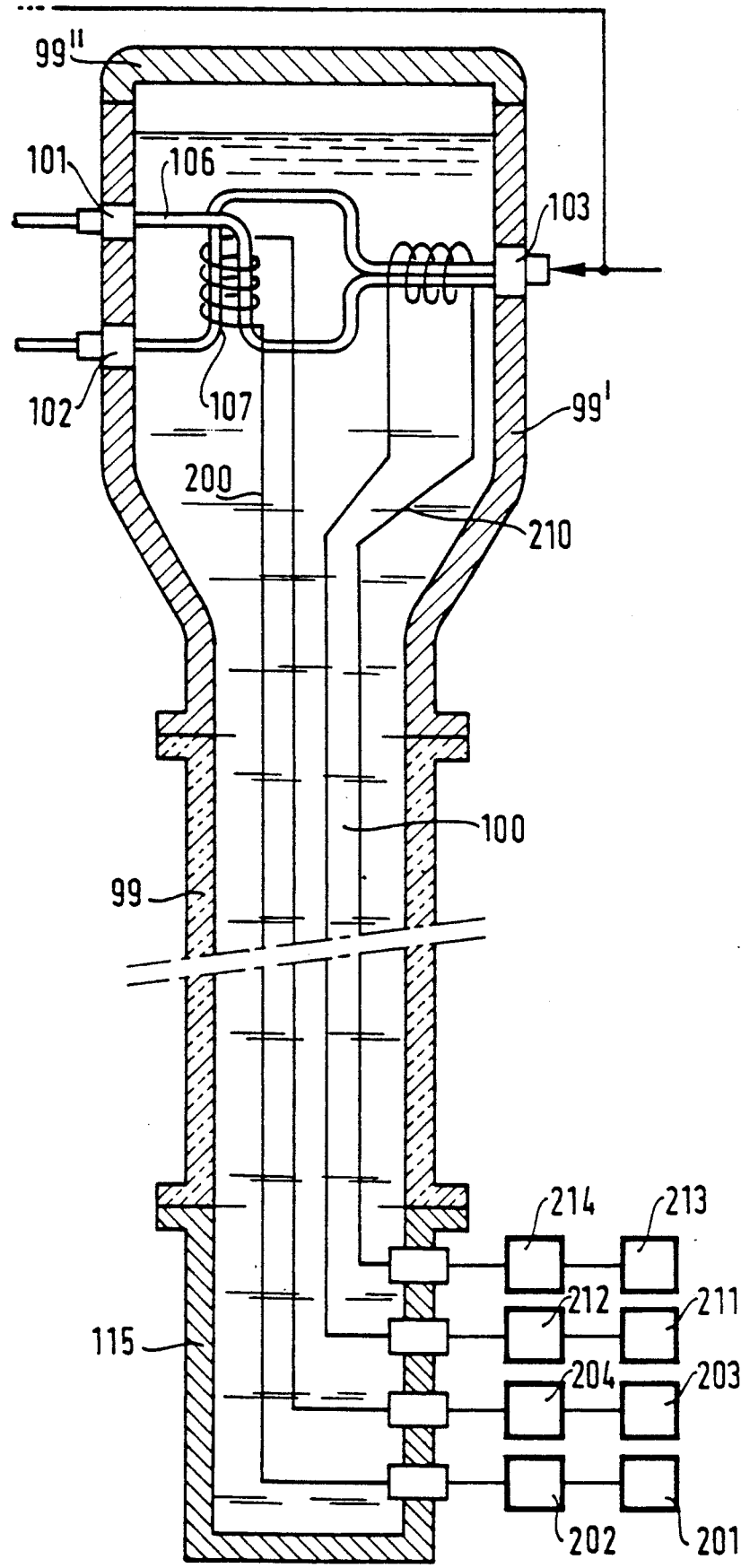
FIG. 3 is a diagram illustrating a quench detection using optical fibers.

FIG. 3 shows quench detecting means using an optical fiber device and the Faraday effect. The parts in this figure like those in FIG. 1 bear like numerals.

In this example, dIo is measured by detecting the Faraday effect in a single mode optical fiber 200 wound around the two conductors 106 and 107 oppositely juxtaposed. The fiber is supplied from a light source 201, for example a laser, followed by a polarizer 202. The measurement is made by means of a detector 203 preceded by an analyzer 204. More details on this method can be found in U.S. Pat. No. 4,298,245.

The measuring of Io is done by means of a second single mode optical fiber 210—wound around the two conductors 106 and 107 and arranged so that the current flows in the same direction, the fiber being supplied from a light source 211 associated with a polarizer 212—whose output signal is picked up by a detector 213 preceded by an analyzer 214.

Figure 4:
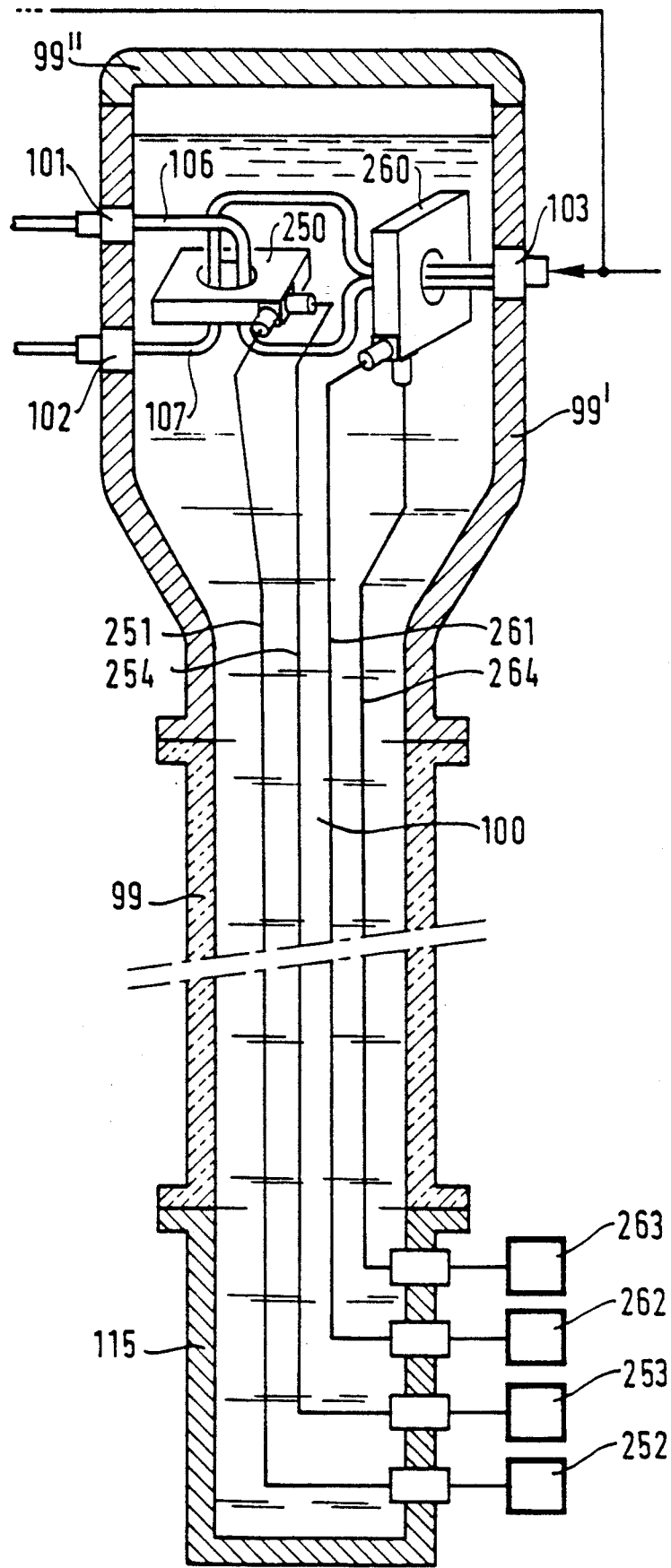
FIG. 4 is a diagram showing a detection by means of magneto-optical prisms.

The diagram of FIG. 4 shows a detection by means of Faraday magneto-optical or rotating prisms. Parts common to this figure and to FIG. 1 bear like numerals in both figures.

To measure dIo, a first prism 250 is used, which is supplied with light from an optical fiber 251 fed from a source 252; after going through the prism, the light is collected and routed to a detector 253 through a second optical fiber 254. The first prism is strung onto the oppositely juxtaposed conductors 106 and 107.

To measure Io, a second prism 260 is used, this prism being strung onto conductors 106 and 107 arranged so that the current flows in the same direction in both conductors, said prism 260 being associated with a first optical fiber 261 supplied with light from a light source 262 and with a second optical fiber 263 equipped with a detector 264. More details can be found in U.S. Pat. No. 4,298,245.

Figure 5:
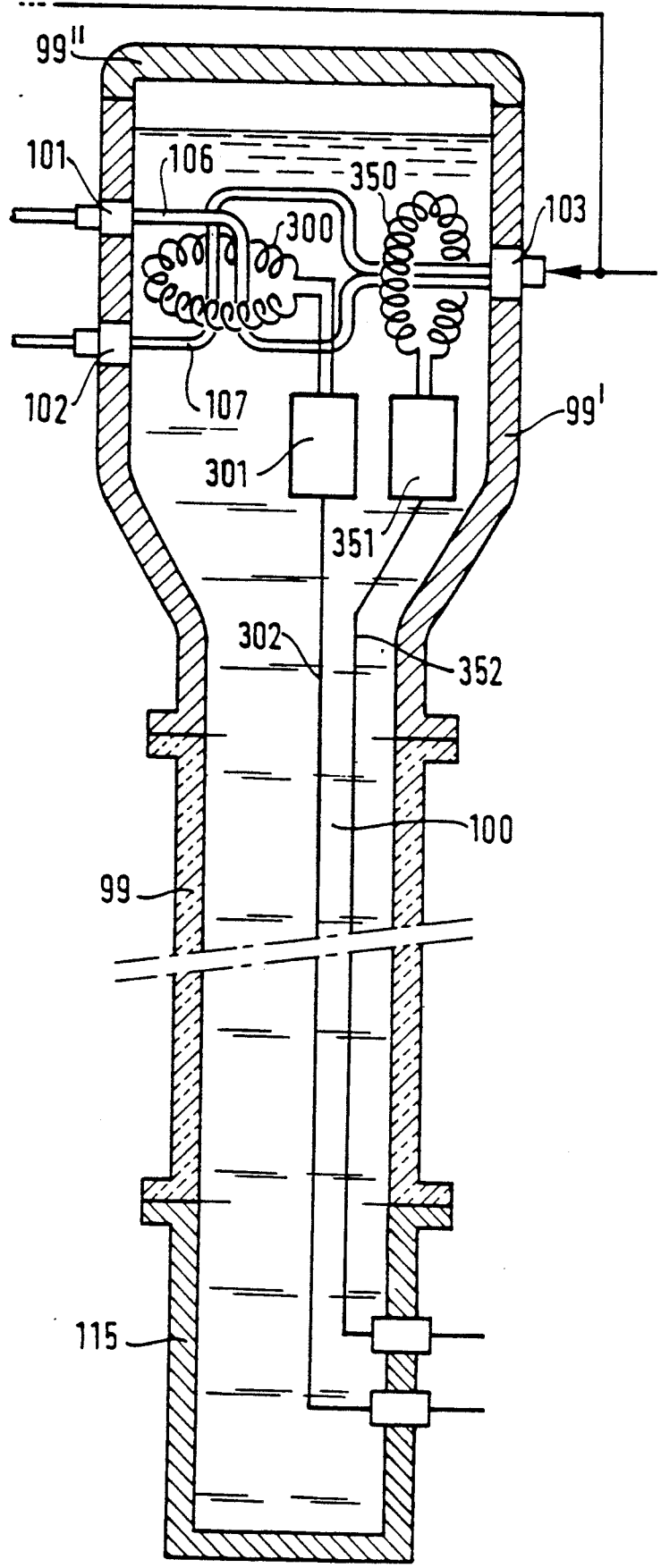
FIG. 5 is a diagram showing a detection by means of Rogowski coils.

FIG. 5 diagrams a detection of dIo and Io by means of Rogowski coils 300 and 350, respectively associated with electronic measuring circuits 301 and 351 suitable for the potential of high voltage. The data is brought back through optical fibers 302 and 352. More details about this approach can be found in European patent application No. 0288998.

The device according to the invention is simple and economical to build. It applies to all the voltage levels with which a superconducting element may be called upon to work. It has a very high sensitivity which is further enhanced by the possibility it affords of choosing the best detection mode: by measuring either the difference in current intensities, the difference in phases or the difference in capacitive voltages.

We claim:

1. A device for detecting quenching of a portion of a superconductor element comprising: two identical superconducting conductors coupled to non-superconducting conductors in each of which a current flows, and electrically connected in parallel, and means for detecting a threshold value of one of a difference of intensity and a phase-difference between said currents flowing in said device indicative of quenching of a portion of said superconductor element.

2. Device according to claim 1, wherein said detecting means comprises a current transformer comprising a magnetic toroidal core traversed by said non-superconducting conductors positioned so that the currents therein pass through the core flow in opposite directions, said toroidal core comprising a secondary winding having terminals providing a first, current intensity difference signal proportional to said difference of intensity.

3. Device according to claim 2, wherein said detecting means further comprises a second toroidal magnetic core traversed by said non-superconducting conductors arranged so that the currents therein traverse said second core flow in the same direction, said second toroidal magnetic core comprising a secondary winding having terminals providing a second signal proportional to the sum of the currents in said conductors, and means for sending said second signal and said first, current intensity difference signal to an electronic circuit for supplying a phase difference signal, the threshold value of which is indicative of quenching a portion of said superconductor element.

4. Device according to claim 1, wherein said detecting means comprises an optical fiber supplied from a source of polarized light, said optical fiber being wound several times around the non-superconducting conductors and the conductors positioned so that the currents therein flow in opposite directions, and means for collecting the light on leaving said optical fiber by an analyzer.

5. Device according to claim 4, wherein said detecting means further comprises a second optical fiber supplied from a source of polarized light, said second optical fiber being wound several times around the conductors and the conductors positioned so that their current flow in the same direction, and means for collecting the light on leaving the second optical fiber by a second analyzer, and means for sending signals from said first and second analyzers to an electronic circuit supplying a signal indicative of said phase difference.

6. Device according to claim 1, wherein said detecting means comprises a first Faraday rotator traversed by said conductors arranged so that their currents flow in opposite directions, said first Faraday rotator being connected to a first optical fiber supplied from a light source and to a second optical fiber connected to an analyzer.

7. Device according to claim 6, wherein said detecting means further comprises a second Faraday rotator traversed by said conductors arranged so that their currents flow in the same direction, said second rotator being associated with a third optical fiber supplied from a light source and with a fourth optical fiber connected to a second analyzer, and means addressing the signals from said first and second analyzers to an electronic circuit for supplying said phase difference.

8. Device according to claim 1, wherein said detecting means comprises a Rogowski coil traversed by said conductors arranged so that currents therein flow in opposite directions, and said Rogowski coil being operatively associated with a first electronic signal processing circuit.

9. Device according to claim 8, wherein said detecting means further comprises a second Rogowski coil associated with a second electronic signal processing circuit, and means for processing said signals from said first and second signal processing circuits by an electronic circuit supplying said phase difference.

10. A current limiter for connection into an electrical line in series with a circuit breaker having a small interrupting capacity, said current limiter comprising a cryostat housing a superconducting element consisting of two identical superconductor coils, wound coaxially in opposite directions, said coils being arranged in parallel, and said coils having ends respectively coupled to mutually insulated conductors which extend to the outside of the cryostat, said insulated conductors constituting the primary of a current transformer comprising a magnetic toroidal core through which said insulated conductors pass carrying currents flowing in opposite directions, said toroidal core further comprising a secondary winding having terminals across which a first signal is generated representative of the difference between the values of the currents in said conductors.

11. A current limiter as claimed in claim 10, having a second magnetic toroidal core through which said insulated conductors also pass, said insulated conductors being arranged so that the currents flow in the same direction therein, said second toroidal core comprising a secondary winding having terminals across which a second signal is generated representative of the sum of currents flowing in said insulated conductors, and means for sending both said second signal and the first, differential intensity signal to an electronic circuit generating a phase difference signal.

12. A current limiter according to claim 10, further provided with a device for measuring the capacitive voltage differences between two points upstream and downstream from said superconductor coil.

13. A current limiter for connection into an electrical line in series with a circuit breaker having a small interrupting capacity, said current limiter comprising a cryostat housing a superconducting element consisting of two identical superconductor coils, wound coaxially in opposite directions, said coils being arranged in parallel, said coils having ends coupled respectively to mutually insulated conductors which extend to the outside of the cryostat, said insulated conductors being coupled to said means for detecting a difference of intensity of the current flowing in said insulated conductors comprising an optical fiber supplied from a source of polarized light, wound several times around said insulated conductors and said insulated conductors being arranged so that their currents flow in opposite directions therein, and an analyzer for picking up the light leaving the optical fiber.

14. A current limiter as claimed in claim 13, further comprising means for detecting the phase difference between the currents in said coils, said means for detecting the phase difference comprising a second optical fiber supplied from a polarized light source, said second optical fiber being wound several times around said insulated conductors arranged so that the currents flow in the same direction, a second analyzer for collecting the light leaving the second optical fiber, and means for sending the signals from said first and second analyzers to an electronic circuit supplying said phase difference.

15. A current limiter for connection into an electrical line in series with a circuit breaker having a small interrupting capacity, said current limiter comprising a cryostat housing a superconducting element consisting of two identical superconductor coils, wound coaxially in opposite directions, said coils being arranged in parallel, said coils having ends respectively coupled to mutually insulated conductors which extend to the outside of the cryostat, said insulated conductors being coupled to means for detecting a difference of intensity of current passing therethrough comprising a Faraday rotator through which said conductors, arranged so that their currents flow in opposite directions, pass, means for connecting said Faraday rotator to a first optical fiber supplied from a light source and to a second optical fiber connected to an analyzer.

16. A current limiter according to claim 15, further comprising means for detecting the phase difference between the currents in said coils, said phase difference detecting means comprising a second Faraday rotator through which the conductors, arranged so that their currents flow in the same direction, pass, said second Faraday rotator being operatively associated with a third optical fiber supplied from a light source and with a fourth optical fiber connected to a second analyzer, and means for sending the signals from said first and second analyzers to an electronic circuit for supplying a signal indicative of said phase difference.

17. A current limiter for connection into an electrical line in series with a circuit breaker having a small interrupting capacity, said current limiter comprising a cryostat housing a superconducting element consisting of two identical superconductor coils, wound coaxially in opposite directions, said coils being arranged in parallel, said coils having ends coupled respectively to mutually insulated conductors which extend to the outside of the cryostat, said insulated conductors being coupled to means for detecting a difference of intensity comprising a Rogowski coil through which said conductors, arranged so that the current flows in the opposite direction, pass, and said Rogowski coil being operatively associated with an electronic signal processing circuit.

18. A current limiter according to claim 17, further comprising means for detecting the phase difference between the currents in said coils, said phase difference detecting means comprising a second Rogowski coil through which said conductors arranged so that the current flows in the same direction, pass, and said second Rogowski coil being operatively associated with a second electronic signal processing circuit, and means for processing said signals from said first and second electronic signal processing circuits by an electronic circuit for supplying a signal indicative of the phase difference.

* * * * *